(12) United States Patent
Chou

(10) Patent No.: US 12,038,389 B2
(45) Date of Patent: *Jul. 16, 2024

(54) WAFER INSPECTION APPARATUS AND METHOD

(71) Applicant: Taiwan Semiconductor Manufacturing Company, Ltd., Hsinchu (TW)

(72) Inventor: Chung-Pin Chou, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 103 days.

This patent is subject to a terminal disclaimer.

(21) Appl. No.: 17/717,150

(22) Filed: Apr. 11, 2022

(65) Prior Publication Data
US 2022/0236198 A1    Jul. 28, 2022

Related U.S. Application Data

(63) Continuation of application No. 16/805,849, filed on Mar. 2, 2020, now Pat. No. 11,300,525.

(60) Provisional application No. 62/880,668, filed on Jul. 31, 2019.

(51) Int. Cl.
G01N 21/95      (2006.01)
G01B 11/30      (2006.01)
H01L 21/67      (2006.01)

(52) U.S. Cl.
CPC ....... *G01N 21/9505* (2013.01); *G01B 11/303* (2013.01); *H01L 21/67288* (2013.01); *G01N 2201/06113* (2013.01); *G01N 2201/066* (2013.01); *G01N 2201/10* (2013.01)

(58) Field of Classification Search
CPC ............. G01B 11/303; G01N 21/9505; G01N 2201/06113; G01N 2201/066; G01N 2201/10; G01N 21/9501; H01L 21/67288
See application file for complete search history.

(56) References Cited

U.S. PATENT DOCUMENTS 11,300,525 B2 *   4/2022   Chou .................. G01N 21/9501

\* cited by examiner

*Primary Examiner* — Tri T Ton
(74) *Attorney, Agent, or Firm* — JCIPRNET

(57) ABSTRACT

Wafer inspection apparatuses and methods are described. The wafer inspection apparatus includes an optical module, at least one wafer holder for carrying a plurality of wafers, and a plurality of optical sensors. The optical module is configured to emit a plurality of light beams for simultaneously scanning the plurality of wafers carried by the at least one wafer holder. The plurality of optical sensors is configured to receive the light beams reflected by the plurality of wafers.

20 Claims, 10 Drawing Sheets

WAFER INSPECTION APPARATUS AND METHOD

CROSS-REFERENCE TO RELATED APPLICATION

This application is a continuation application of and claims the priority benefit of a prior application Ser. No. 16/805,849, filed on Mar. 2, 2020 and now allowed. The prior application Ser. No. 16/805,849 claims the priority benefit of U.S. provisional application Ser. No. 62/880,668, filed on Jul. 31, 2019. The entirety of each of the above-mentioned patent applications is hereby incorporated by reference herein and made a part of this specification.

BACKGROUND

Fabricating semiconductor devices typically includes processing a substrate such as a semiconductor wafer using a large number of semiconductor fabrication processes to form various features and multiple levels of the semiconductor devices. The semiconductor fabrication processes may include, but are not limited to, implantation processes, deposition processes such as chemical vapor deposition (CVD), plasma-enhanced CVD (PECVD), physical vapor deposition (PVD), lithography and etching processes, grinding and polishing processes, and so on.

Inspection processes are performed at various steps during the fabrication of the semiconductor devices to detect defects on substrates (e.g. wafers) to promote higher yield in the fabricating process and thus higher profits. In the drive for greater efficiencies throughout the fabrication process, wafer inspection efficiency is a topic of interest.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
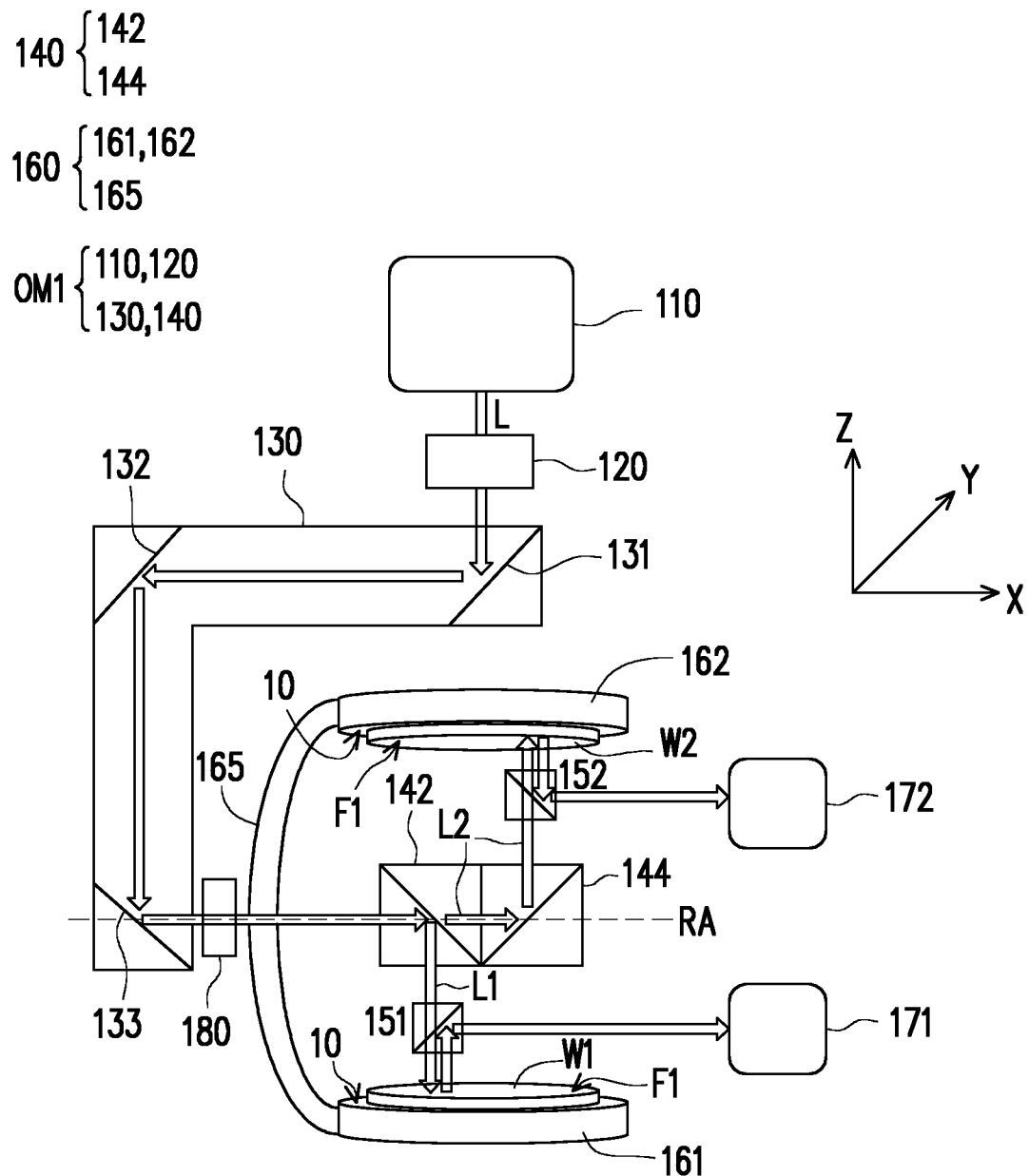
FIG. 1 is a schematic view of an inspection apparatus in accordance with a first embodiment of the disclosure.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the disclosure are directed to provide inspection apparatus (e.g., wafer inspection apparatus) capable of implementing multi-wafer inspection, so as to improve inspection efficiency.

FIG. 1 is a schematic view of an inspection apparatus 100 in accordance with at least one embodiment of the disclosure.

Referring to FIG. 1, in some embodiments, the inspection apparatus 100 is configured to inspect at least two workpieces W1, W2. The inspection apparatus 100 may produce images of inspected workpieces W1, W2 for determining whether either or both of the workpieces W1, W2 has a defect. The workpieces W1, W2 may be substrates. The substrate may include glass, silicon, ceramic, metal, stainless steel, plastic, resin, a composite material, tape, film, or other suitable materials. In some embodiments, the substrate is a semiconductor wafer.

In some embodiments, the inspection apparatus 100 includes an optical module OM1, a workpiece holder 160 for carrying a plurality of workpieces W1, W2, one-way mirrors 151, 152, and optical sensors 171, 172.

The optical module OM1 is configured to emit a plurality of light beams for simultaneously inspecting the workpieces W1, W2 carried by the workpiece holder 160. In some embodiments, the optical module OM1 includes a light source 110, an optical amplifier 120, an optical directional element 130, and an optical splitting element 140. The light source 110 is configured to emit a light L, such as a laser beam.

The optical amplifier 120 is configured to amplify and control the intensity of the light L and thus control the intensities of the light beams L1, L2 split from the light L. The light L emitted from the light source 110 may be further intensified efficiently by using the optical amplifier 120, in order to provide desired optical intensity. In some embodiments, the optical amplifier 120 increases the intensity of the light L to twice or four times or more of its original intensity according to product design and requirement. In some embodiments, the optical amplifier 120 may be a solid-state amplifier, a doped fiber amplifier or a semiconductor optical amplifier, but the disclosure is not limited thereto. In some embodiments, the optical amplifier 120 is a laser amplifier, such as an RF pumped, fast axial flow, $CO_2$ laser amplifier. In some embodiments, the optical amplifier 120 is disposed immediately adjacent to the light source 110, but the disclosure is not limited thereto. Alternatively or additionally, the optical amplifier(s) may be disposed at other positions to adjust the intensity of the light before the light is directed to the workpieces. For example, the optical amplifier may be disposed between the optical direction element 130 and the optical splitting element 140, or disposed between the optical splitting element 140 and the workpiece holder 160. However, the disclosure is not limited thereto.

In some embodiments, the optical module OM1 may optionally include the optical directional element 130 for controlling the optical path of the light L. In some embodiments, the optical directional element 130 includes a reflector unit. The reflector unit may include a plurality of reflective mirrors for guiding the light L in an intended direction. The optical direction element 130 may include reflective mirrors 131, 132 and 133, which may also be referred to as a trombone mirror unit (TMU). Number and configuration of the reflective mirrors included in the optical direction element 130 shown in the figure is merely for illustration, and the disclosure is not limited thereto. Embodiments including other suitable optical elements which can control the optical path of light are also contemplated herein.

The optical splitting element 140 is configured to split the light L into a plurality of light beams for inspecting multiple workpieces carried by the workpiece holder 160. In some embodiments, the optical splitting element 140 may split the light L into two light beams L1, L2 along two opposite vertical directions. The light L may be uniformly split into the two light beams, with the intensity of each of the two light beams being about half the intensity of the light L, but the disclosure is not limited thereto. In some embodiments, the optical splitting element 140 includes a beam splitter 142 and a total reflection mirror 144. When a light is directed to the optical splitting element 140, a portion of (e.g. half of) the incident light is reflected by the beam splitter 142, and another portion of (e.g. half of) of the incident light transmits through the beam splitter 142 and is reflected by the total reflection mirror 144. The beam splitter 142 may split an unpolarized light into two unpolarized lights, or split a polarized light (e.g. p-polarized light or s-polarized light) into two polarized lights, or split an unpolarized light into two polarized light (e.g. p-polarized light and s-polarized light). In some embodiments, the optical splitting element 140 is configured to be fixed during wafer inspection.

In some embodiments, the optical module OM1 further includes one or more polarizers configured to polarize the lights to be directed to workpieces carried by the workpiece holder 160, and the lights may respectively be polarized as p-polarized light or s-polarized light depending on the type of the defect to be detected. A polarizer 180 may be disposed along the light path of the light L at a position before the light L enters the optical splitting element 140 and configured to polarize the light L before being split by the optical splitting element 140. The polarizer 180 may be disposed between the optical directional element 130 and the optical splitting element 140. In some embodiments, the polarizer 180 is omitted, and one or more polarizers (not shown) are configured to polarize the light beam(s) L1, L2 after the light L is split by the optical splitting element 140. One or more polarizers may be disposed between the optical splitting element 140 and the workpiece W1 and/or between the optical splitting element 140 and the workpiece W2, such as between the beam splitter 142 and the one-way mirror 151 and/or between the total reflection mirror 144 and the one-way mirror 152. In some embodiments, the beam splitter 142 is a polarizing beam splitter for splitting an unpolarized light into two polarized lights. The beam splitter 142 may transmit p-polarized light and reflect s-polarized light.

In some embodiments, the workpiece holder 160 includes a plurality of workpiece stages 161, 162 for carrying a plurality of workpieces W1, W2. The workpieces W1, W2 may be substrates, such as wafers. Accordingly, the workpiece holder 160 may include substrate holders, such as wafer holders, and the workpiece stages 161, 162 may be substrate stages, such as wafer stages.

In some embodiments, the wafer holder 160 includes a first wafer stage 161 for carrying a first wafer W1, a second wafer stage 162 for carrying a second wafer W2, and a connecting element 165 for connecting the first and second wafer stages 161 and 162. In some embodiments, the first wafer stage W1 and the second wafer stage W2 are connected to opposite ends of the connecting element 165, and are fixed on the connecting element 165. Herein, the wafer stages being fixed on the connecting element means that the relative positional relation between the wafer stages and the connecting element are fixed. The connecting element 165 may be connected to sidewalls of the wafer stages 161 and 162, but the disclosure is not limited thereto. In some embodiments, the connecting element 165 is connected to back surfaces of the wafer stages 161 and 162. Herein, the back surface of the wafer stage refers to the surface opposite to the front surface 10 (i.e. receiving surface 10) of the wafer stage for receiving a wafer. In some embodiments, the wafer stages 161, 162 are symmetric about the connecting element 165, but the disclosure is not limited thereto. In some embodiments, the wafer stages 161, 162 are configured as face to face, such that the front surfaces F1 of wafers W1, W2 to be inspected are configured as face to face. In some embodiments, the wafer stages 161, 162 are disposed at opposite sides of the optical splitting element 140.

In some embodiments, the wafer holder 160 is operable. For example, the wafer holder 160 is able to rotate about a rotation axis RA. The rotation axis RA may be along the horizontal direction X which passes through the center of the connecting element 165. The rotation axis RA is along a direction parallel with the receiving surfaces 10 of the wafer stages 161 and 162 or the front surfaces F1 of the wafers W1, W2 carried by the wafer stages. In some embodiments, the wafer holder 160 rotates about the rotation axis RA in a clockwise or a counterclockwise direction by any reasonable degree (e.g. 0 to 360 degrees). That is to say, the wafer stages 161, 162 of the wafer holder 160 are able to rotate about the rotation axis RA, such that the wafers W1, W2 carried by the wafer stages 161, 162 of the wafer holder 160 rotate as the wafer holder 160 rotates. In some embodiments, during wafer inspection, the wafer holder 160 stops rotating and is located at the inspection position as shown in FIG. 1. In some embodiments, the wafer stages 161, 162 are located at opposite vertical sides of the optical splitting element 140 and are overlapped with the optical splitting element 140 in the vertical direction Z during inspection. In some embodiments, the first wafer stage 161 is disposed below the optical splitting element 140, and the second wafer stage 162 is disposed over the optical splitting element 140. The wafer holder 160 is movable along the horizontal directions, such as the directions X, Y.

In alternative embodiments, the wafer holder 160 is movable in the horizontal directions, such as the directions X, Y, but is not rotatable. For example, the wafer holder 160 is configured to be fixed at the inspection position as shown in FIG. 1 and is not rotatable.

In the present embodiments, when the wafer holder 160 moves along the horizontal direction (e.g. direction X or direction Y), the wafers W1, W2 carried by the wafer holder 160 simultaneously move along a same direction as the wafer holder 160 moves.

In some embodiments, the wafer stages 161, 162 are or include an electrostatic chuck (E-chuck), respectively. The E-chucks use an electric force to secure the wafers W1, W2. In other embodiments, the wafer stages 161, 162 respectively include a chuck that uses clamps to secure the wafers W1, W2. In alternative embodiments, the wafer stages 161, 162 respectively include a vacuum chuck that generates vacuum pressure through vacuum ports in the chuck to hold the wafers W1, W2 thereon. Combinations of the above chucks may also be used. However, the disclosure is not limited thereto. The wafers W1, W2 may be carried by the wafer stages 161, 162 through any appropriate mounting force.

Figure 7:
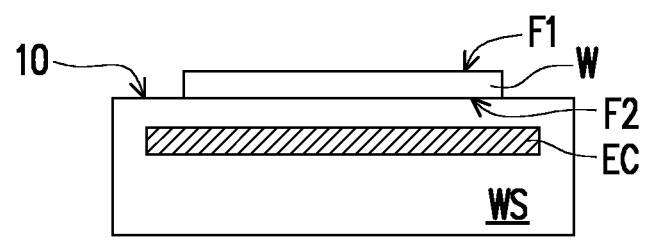
FIG. 7 is a schematic cross-sectional view illustrating a wafer carried by a wafer stage according to some embodiments of the disclosure.

FIG. 7 is a schematic cross-sectional view illustrating a wafer W carried by a wafer stage WS including an E-chuck. The wafer stage WS may be one of the wafer stages 161, 162, and the wafer W may be the corresponding one of the wafers W1, W2.

Referring to FIG. 7, in some embodiments, the E-chuck of the wafer stage WS includes an electrode EC embedded near the receiving surface 10 for receiving the wafer W, and the receiving surface 10 is directly over and overlaps the electrode EC. The electrode EC may be covered by a dielectric material such as an oxide or a ceramic, or the like, so as to separate the electrode EC from the wafer W. In other words, the receiving surface 10 is a surface of the dielectric material. In some embodiments, the electrode EC is electrically coupled to a power source (not shown). A voltage provided by the power source may be applied to the electrode EC. In some embodiments, the power source may be configured to provide a direct current (DC) or alternating current (AC) power to the electrode EC. In some other embodiments, the power source is configured to provide radio frequency (RF) power to the electrode EC. In a chucking mode, the power source is turned on, and a high voltage is provided by the power source and applied to the electrode EC. The electrode EC is then charged to generate an electrostatic force to attract the wafer W, such that the wafer W is secured by the wafer stage WS. In some embodiments, the wafer W is in contact with the receiving surface 10 of the dielectric material, but the disclosure is not limited thereto. In alternative embodiments, a supporting element (not shown) may be disposed between the wafer W and the receiving surface 10, such that the wafer W is not in direct contact with the receiving surface 10 and a gap exists between the wafer W and the receiving surface 10 of the wafer stage WS. The wafer W has a front surface F1 and a back surface F2. Throughout the specification, the front surface F1 of the wafer refers to the surface to be inspected, and the back surface F2 of the wafer refers to the surface opposite to the front surface and facing the receiving surface of the wafer stage. That is, the back surface F2 of the wafer W may be in contact with or separate from the receiving surface 10 of the wafer stage WS. In a de-chucking mode, the power source is turned off, and the electrostatic force is eliminated, such that the wafer W may be removed from the wafer stage WS.

Referring back to FIG. 1, in some embodiments, the optical splitting element 140 is located between the wafer stage 161 and the wafer stage 162. In some embodiments, the distance between the optical splitting element 140 and the wafer stage 161 and the distance between the optical splitting element 140 and the wafer stage 162 are the same or different.

The one-way mirrors 151 and 152 are disposed between the optical splitting element 140 and the wafer stages 161 and 162, respectively. In some embodiments, the one-way mirror is configured to transmit the light incoming from a first side, and reflect the light incoming from a second side opposite to the first side.

The optical sensors 171, 172 are configured to receive the light beams reflected by the wafers W1, W2, and generate the inspection results (e.g. images) of the wafers W1, W2. In some embodiments, the optical sensors 171, 172 may include time delay and integration (TDI) sensors, but the disclosure is not limited thereto. Other suitable optical image capturing components may also be used.

Figure 6:
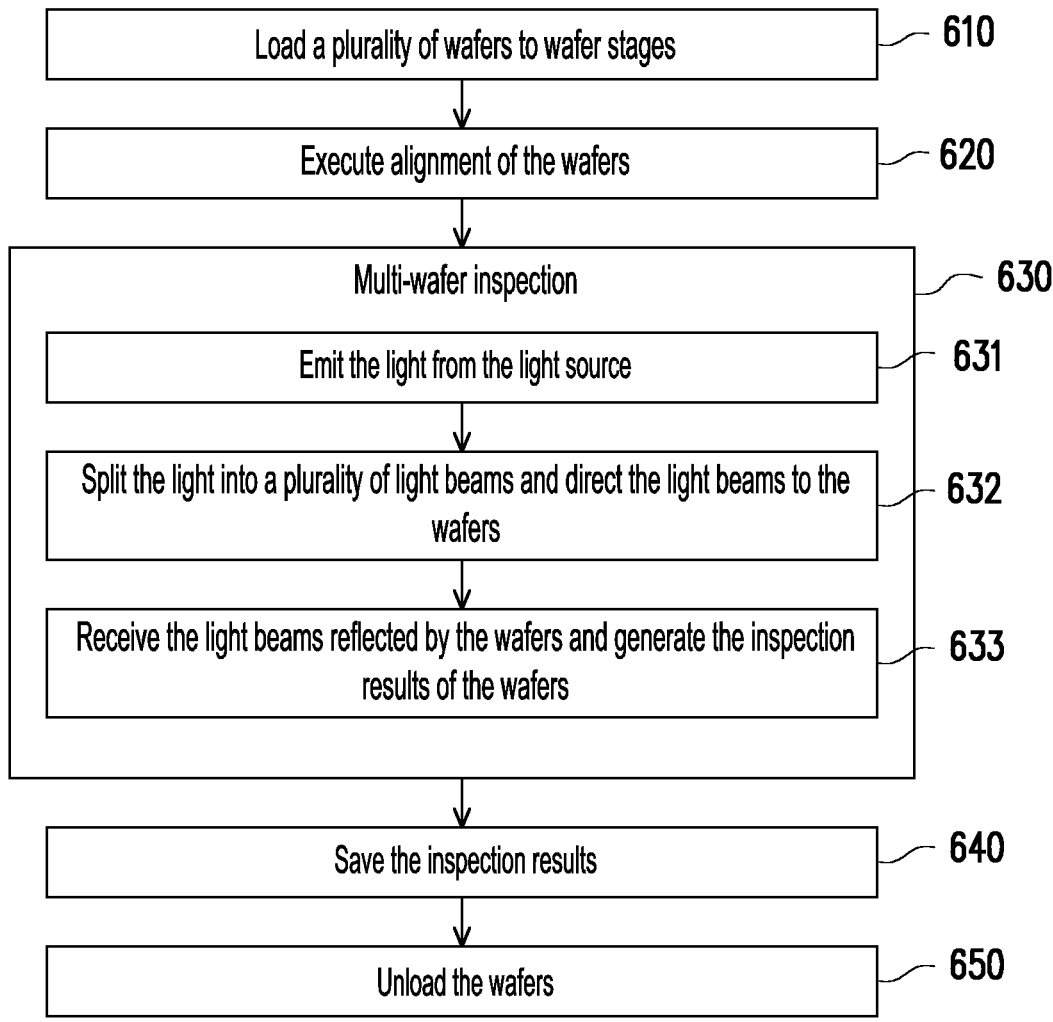
FIG. 6 is a flowchart illustrating an inspection method using the inspection apparatus in accordance with some embodiments of the disclosure.

FIG. 6 is a flowchart of an inspection method using the inspection apparatus described herein. Although the method is illustrated and/or described as a series of acts (processes) or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

The inspection method may be used to inspect any kind of workpiece, such as a substrate. In some embodiments, the substrate is a semiconductor wafer, and an illustrative embodiment of a wafer inspection method is described as below with reference to FIG. 1 and FIG. 6.

Referring to FIG. 1 and FIG. 6, in some embodiments, the wafers may be loaded to the inspection apparatus before or after the processing of wafer(s). For example, after the wafer(s) is/are subjected to deposition process(es), such as CVD, PECVD to deposit a dielectric layer or a polymer layer, lithography and etching processes, chemical mechanical polishing (CMP) processes and/or any other appropriate semiconductor fabrication processes, the wafers W1, W2 are loaded to the inspection apparatus to be inspected, so as to determine whether the wafers have defect. In some embodiments, the wafer holder includes a plurality of wafer stages, and multiple wafers carried by multiple wafer stages are inspected simultaneously.

In some embodiments, at act 610, a plurality of wafers are loaded to the wafer stages of the wafer holder. For example, the wafer W1 is loaded to the wafer stage 161 of the wafer holder 160, and the wafer W2 is loaded to the wafer stage 162 of the wafer holder 160. The wafers W1, W2 may be carried by the wafer stages 161, 162 by electrostatic force and/or mechanical force. In some embodiments in which the wafer holder 160 is rotatable, the loading of the each of the wafers W1, W2 is performed at a loading position. The loading position refers to a position where the receiving surface 10 of the wafer stage 161 or the wafer stage 162 faces upward, such as the position of the wafer stage 161 shown in FIG. 1. In some embodiments, before the wafers W1, W2 are loaded, the wafer stage 162 rotates to the loading position (i.e. the position where the wafer stage 161 is located shown in FIG. 1) such that the receiving surface 10 of the wafer stage 162 faces upward. The wafer stage 162 is at a lower position for loading, and the wafer stage 161 is at an upper position over the wafer stage 162 (not shown). Thereafter, the wafer W2 is loaded onto the receiving surface 10 of the wafer stage 162 with the front surface F1 of the wafer W2 facing upward. In some embodiments, the wafer W2 is placed on the wafer stage 162 by a mechanical arm (not shown), with the front surface F1 thereof facing up. Thereafter, in some embodiments in which the wafer stage 162 includes an E-chuck as described in FIG. 7, the power source of the E-chuck is turned on, and the electrode EC is charged to generate an electrostatic force to attract the wafer W2, such that the wafer W2 is secured by the wafer stage 162.

After the wafer W2 is held by the wafer stage 162, the mechanical arm moves away. The wafer holder 160 then rotates around the rotation axis RA by 180 degrees along clockwise or counterclockwise direction. That is, the wafer holder 160 is flipped upside down, such that the wafer stage 161 rotates to the loading position with the receiving surface 10 thereof facing upward for loading a wafer, while the wafer W2 carried by the wafer stage 162 is moved to the upper position as shown in FIG. 1 and the front surface F1 of the wafer W2 faces downward. In some embodiments, the electrostatic force generated by the E-chuck of the wafer stage is strong enough to avoid the wafer W2 detaching from the wafer stage 162 when the wafer stage 162 rotates to the upper position.

Thereafter, the wafer W1 is loaded to the wafer stage 161 by the loading method similar to that of the wafer W2 as described above. The wafer W1 is placed on the wafer stage 161 by the mechanical arm (not shown) with the front surface F1 of the wafer W1 facing up. In the embodiments is which the wafer stage 161 includes a E-chuck (FIG. 7), the power source of the E-chuck is turned on, and the electrode EC is charged to generate an electrostatic force to attract the wafer W1, such that the wafer W1 is secured by the wafer stage 161.

After the wafers W1, W2 are secured by the wafer stages 161, 162, the wafer holder 160 may rotate to the inspection position and stop rotating for wafer inspection. An inspection position refers to the position of the wafer holder 160 during inspection. In some embodiments, the wafer stages 161, 162 are located at opposite vertical sides of the optical splitting element 140, as shown in FIG. 1.

In some embodiments in which the wafer holder 160 is not rotatable, the wafer stages 161, 162 are designed and configured to be at the inspection position. The wafers W1, W2 are respectively loaded to the wafer stages 161, 162 at the position shown in FIG. 1. In some embodiments, the first wafer stage 161 is at the lower position and the second wafer stage 162 is at the upper position. The receiving surfaces 10 of the wafer stages 161, 162 are in a face-to-face configuration. The receiving surface 10 of the wafer stage 161 faces upward, while the receiving surface 10 of the wafer stage 162 faces downward. The wafer W1 is placed on the wafer stage 161 by a mechanical arm with the front surface F1 of the wafer W1 facing up, and the wafer W1 is then secured by the wafer stage 161 through electrostatic force and/or mechanical force, for example. The wafer W2 is moved to the wafer stage 162 at the upper position by a mechanical arm, such that the front surface F1 of the second wafer W2 faces downward. In some embodiments, the wafer stage 162 includes an E-chuck to attract and secure the wafer W2 by electrostatic force. In some other embodiments, the wafer stage 162 includes both a clamp and an E-chuck. The clamp provides initial force to hold the wafer W2 by mechanical force, then the E-chuck attracts the wafer W2 by electrostatic force, so as to hold the wafer W2 firmly. In some embodiments, the electrostatic force is strong enough to prevent detachment of the wafer W2 from the wafer stage 162. After the wafers W1, W2 are held by the wafer stages 161, 162, the mechanical arms move away. In some embodiments, one mechanical arm is used to load the wafers W1, W2 to the wafer stages 161, 162 sequentially. In alternative embodiments, two mechanical arms are used to load the first wafer W1 and the second wafer W2 simultaneously.

In some embodiments, after the wafers are loaded to the wafer stages, an alignment is executed, as shown in the act 620 of FIG. 6. In some embodiments, the inspection method adopts a wafer coordinate system for determining and recording the positions of a point (such as a defect) of the wafer. The coordinate system includes an x coordinate and a y coordinate, and a coordinate of the point may be expressed as (x value, y value). In some embodiments, the alignment is executed to determine a reference point of the wafer as an origin of the wafer coordinate system, and the coordinates of all points on the wafer are determined with respect to the origin. In some embodiments, after the wafers W1, W2 are secured in place by the wafer stages 161, 162, light beams, such as the light beams L1, L2 emitted from the optical module OM1, irradiate the wafers W1, W2, respectively. The points aligned with the light beams L1, L2 may be selected to be the origin of the wafer coordinate system of the wafer W1, W2. In some embodiments, an alignment mark is disposed at each origin of the wafers W1, W2. The above alignment method is but one suitable process for determining an origin of wafer coordinate system, and any other appropriate alignment method in the field may also be used.

At act 630, a plurality of wafers such as the wafers W1 and W2 are inspected simultaneously. In some embodiments, the act 630 includes the act 631 (emitting light from a light source), the act 632 (splitting the light into light beams) and the act 633 (receiving the light beams reflected by the wafers). More detailed description of each of these acts 631, 632, 633 follows.

At act 631, a light is emitted from a light source. In some embodiments, a light L, such as a laser beam, is emitted by the light source 110. In some embodiments, the light L emitted by the light source 110 enters an optical amplifier 120, and is amplified by the optical amplifier 120. The optical amplifier 120 controls the optical intensity of the light L and increases the optical intensity of the light L to any desired intensity.

At act 632, the light L is split into a plurality of light beams, and the plurality of light beams are directed to the wafers W1, W2 for multi-wafer inspection. In some embodiments, after the light L is amplified by the optical amplifier 120, the light L is guided to the optical splitting element 140 by the optical directional element 130. In some embodiments, the light L enters the optical directional element 130, and is reflected by the reflective mirrors 131, 132, 133 in sequence, and then directed toward the optical splitting element 140.

Thereafter, the light L is split by the optical splitting element 140 into a first light beam L1 and a second light beam L2 along different light paths for inspecting the wafers W1, W2, respectively. In some embodiments, the light L enters the beam splitter 142 and is split by the beam splitter 142 into a first light beam L1 and a second light beam L2. In some embodiments, a portion (such as, half) of the light L is reflected by the beam splitter 142 as the first light beam L1 directed toward the wafer W1. Another portion (such as, half) of the light L transmits through the beam splitter 142 as the second light beam L2. The second light beam L2 is then reflected by the total reflection mirror 144 and is directed toward the wafer W2. In some embodiments, the first light beam L1 and the second light beam L2 exiting from the optical splitting element 140 exit in opposite directions along the vertical direction Z. In some embodiments, the first light beam L1 travels downward to the wafer W1, and the second light beam L2 travels upward to the wafer W2.

In some embodiments, the first light beam L1 coming out from the optical splitting element 140 passes through the one-way mirror 151 and shines on the front surface F1 of the wafer W1. The second light beam L2 coming out from the optical splitting element 140 passes through the one-way mirror 152 and shines on the front surface F1 of the wafer W2. In some embodiments, the light beams L1, L2 are directed to the wafers W1, W2 at a substantially normal angle of incidence.

With the first light beam L1 and the second light beam L2 shining on the front surfaces F1 of the wafers W1, W2, the wafer holder 160 moves in the horizontal directions, such as the directions X, Y. Meanwhile, the optical splitting element 140 is fixed. As such, the wafers W1 and W2 carried by the wafer holder 160 simultaneously move along the same horizontal directions as the wafer holder 160 moves, such that the whole front surfaces F1 of the wafers W1 and W2 are scanned by the first light beam L1 and the second light beam L2, respectively. In some embodiments, the first light beam L1 and the second light beam L2 shinning on the wafers W1 and W2 may have the same intensities, and the intensity of each of the first light beam L1 and the second light beam L2 may be half of the intensity of the light L after being amplified by the optical amplifier 120.

In some embodiments, depending on the type of defect to be inspected, the wafer may be scanned by a polarized light or an unpolarized light, that is, the first beam L1 and the second light beam L2 directed to the wafers W1 and W2 may respectively be a polarized (e.g. s-polarized or p-polarized) light or an unpolarized light. In some embodiments in which the polarizer 180 is disposed before the optical splitting element 140, the light L emitted by the light source 110 is polarized before the light L is split by the optical splitting element 140, and the light L may be polarized as a p-polarized or s-polarized light. The polarized light L is split by the optical splitting element 140 into polarized light beams L1 and L2. In such embodiments, the first and second light beams L1 and L2 have the same polarization. In some other embodiments, the light may be polarized after being split into the first and second light beams. In some embodiments in which the polarizer 180 is omitted, and one or more polarizers are disposed between the optical splitting element 140 and the one-way mirror 151 and/or between the optical splitting element 140 and one-way mirror 152, the light L is firstly split into the first light beam L1 and the second light beam L2, and thereafter, the first light beam L1 and/or the second light beam L2 may be polarized before transmitting through the one-way mirror 151 and/or 152. In such embodiments, at least one of the first and second light beams L1 and L2 shining on the wafers W1 and W2 is polarized, and the polarization of the first and second light beams L1 and L2 may be the same or different. In some embodiments in which the optical splitting element 140 is a polarizing optical splitting element, the light L is split into two polarized light L1 and L2 having different polarizations. In some embodiments, the first light beam L1 is p-polarized light, and the second light beam L2 is s-polarized light. In some embodiments, the polarizers are omitted, and unpolarized light L is split by the optical splitting element 140 into two unpolarized light beams L1 and L2.

At act 633, the light beams L1, L2 reflected by the wafers W1, W2 are received by the optical sensors 171, 172, so as to generate the inspection results of the wafers W1, W2. In some embodiments, the first light beam L1 and the second light beam L2 shone on the wafers W1 and W2 are reflected by the front surfaces F1 of the wafers W1 and W2, respectively. The first light beam L1 reflected by the wafer W1 is then reflected by the one-way mirror 151 and directed to the optical sensor 171. The second light beam L2 reflected by the wafer W2 is then reflected by the one-way mirror 152 and directed toward the optical sensor 172.

The optical sensor 171 receives the first light beam L1 reflected from the wafer W1, and generates an inspection result of the wafer W1. The optical sensor 172 receives the second light beam L2 reflected from the wafer W2, and generates an inspection result of the wafer W2.

At act 640, the inspection results of wafers are saved for further analysis. In some embodiments, the inspection results may be transmitted to and stored by a storage medium, such as a computing system. In some embodiments, the inspection results are the images of the front surfaces F1 of the wafers W1 and W2. In some embodiments, neighbor-die comparison method is performed to determine whether the wafer W1, W2 has a defect or not. Taking the wafer W1 as an example, the image of the wafer W1 captured by the optical sensor 171 includes the images of a plurality of dies in die regions of the wafer W1. The image of one die (namely, center die) is compared to images of its immediate neighbor dies using an optical testing method. The method then moves to the next die and compares the image of the next die against the images of its neighbor die. The above comparison is repeated until all of the dies in the wafer W1 have been compared. During the comparison, if any difference (which may be a defect) is found, the difference is noted and the die having the difference is marked. In some embodiments, the coordinate of the difference in the wafer coordinate system is recorded. The coordinate of the difference refers to the position of the difference with respect to the origin of the wafer coordinate system determined at act 620. Thereafter, a defect review process is performed. In some embodiments, the wafer W1 is inspected again by a scanning electron microscope (SEM) to get a clearer image of the wafer W1 to double-check the difference and to determine whether the wafer W1 has a defect. In some embodiments, another appropriate comparison method may be used. In some embodiments, the images of the wafers W1 and W2 are compared with reference images to determine whether the wafers W1 and W2 have defects. In some embodiments, the reference images may be images of wafers with or without defects.

At act 650, the wafers W1 and W2 are unloaded from the wafer stages 161 and 162. In some embodiments, the power source of the E-chuck is turned off, and the wafer W1, W2 is unloaded from the wafer stage 161/162 by mechanical arm for further processing. If the wafer is determined to have a defect, appropriate processes may be performed to eliminate the defect before performing further semiconductor fabrication process.

Figure 2A:
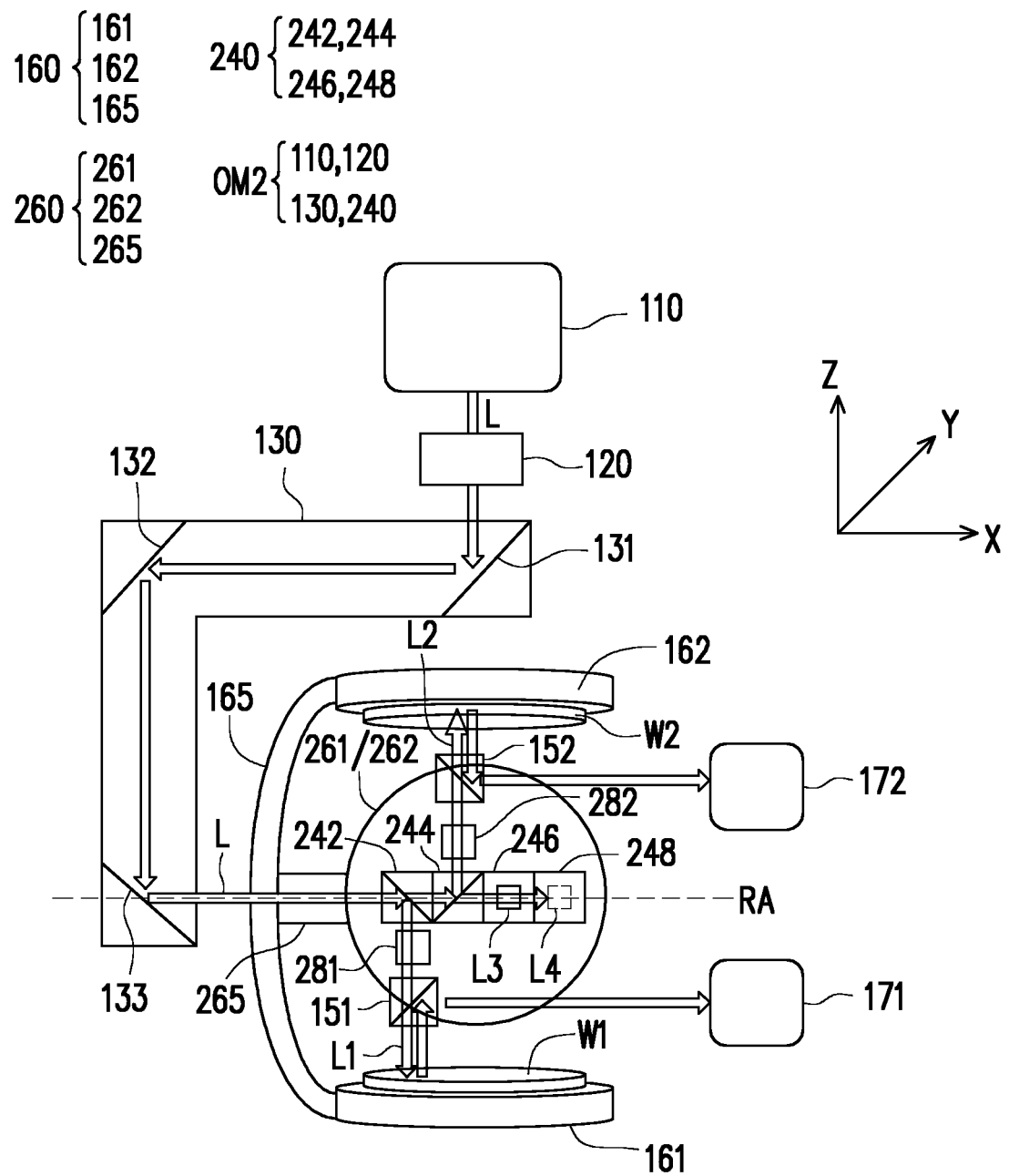
FIG. 2A is a schematic view of an inspection apparatus in accordance with a second embodiment of the disclosure.
Figure 2B:
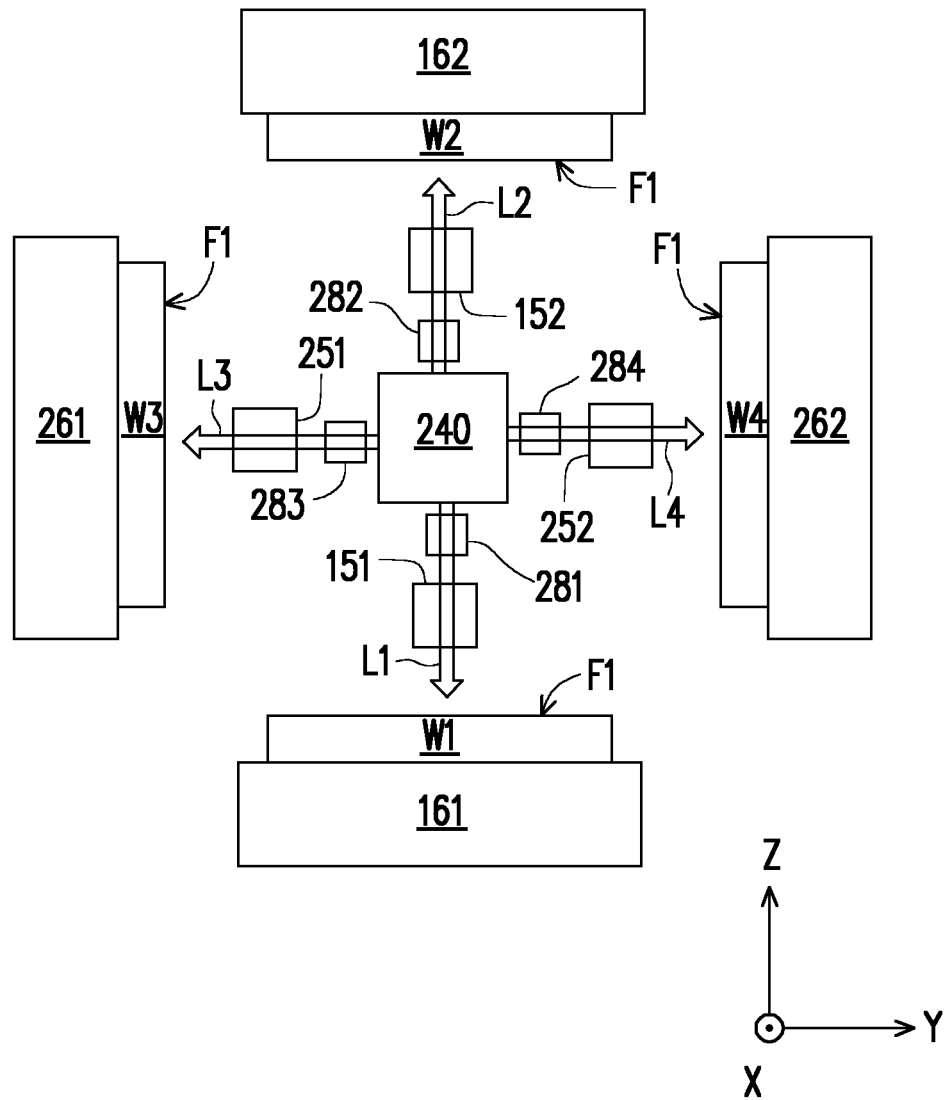
FIG. 2B is a schematic view of the configuration of wafer stages and optical components of the inspection apparatus in accordance with the second embodiment of the disclosure.
Figure 2C:
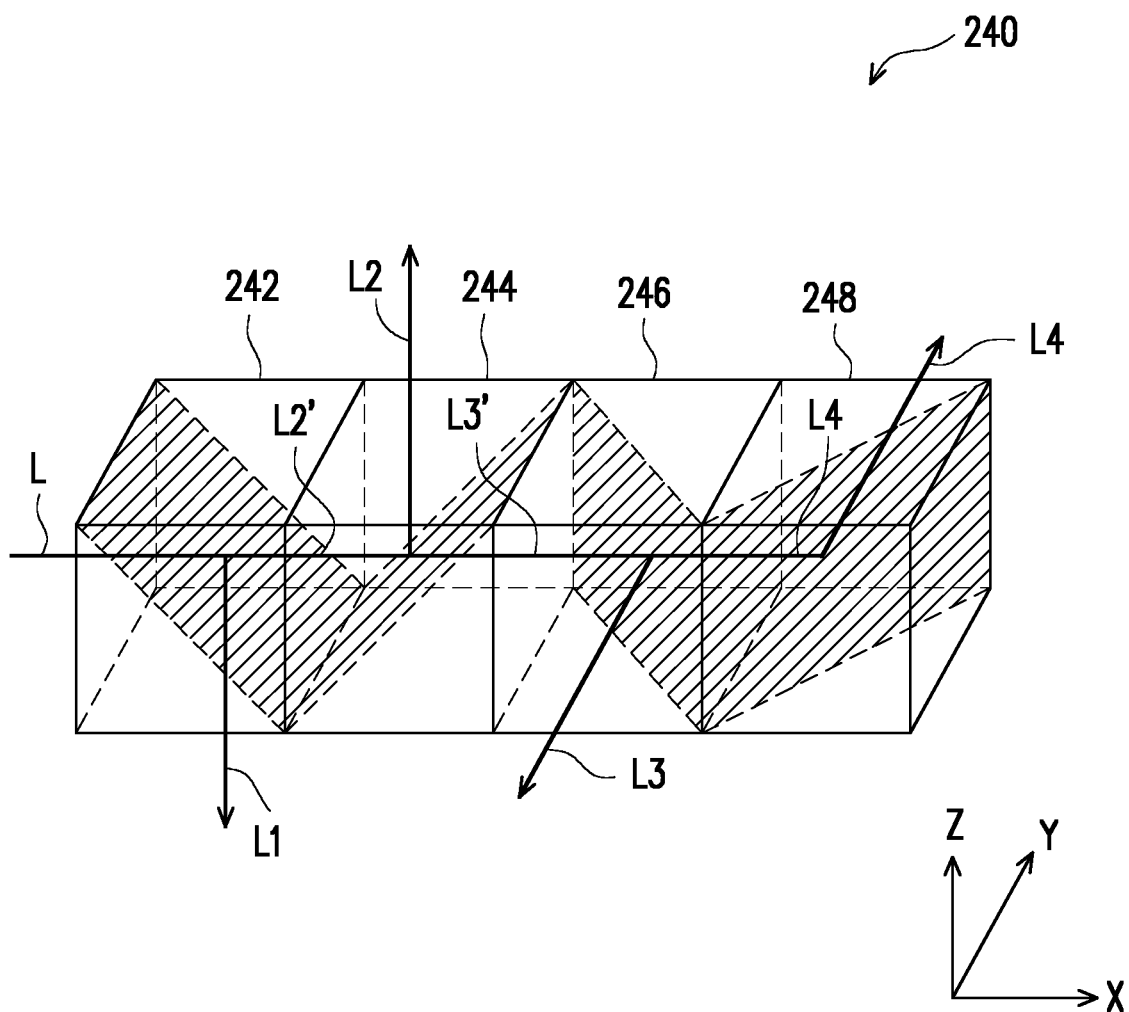
FIG. 2C is a perspective view of an optical splitting element of the inspection apparatus in accordance with the second embodiment of the disclosure.

FIG. 2A is a schematic view of an inspection apparatus 200 according to various embodiments of the disclosure. FIG. 2B is a schematic view of the configuration of wafer stages and optical components of the inspection apparatus 200 according to various embodiments of the disclosure. FIG. 2B is a right side view of FIG. 2A, and some components are omitted in FIG. 2B for sake of brevity. FIG. 2C is a perspective view of an optical splitting element of the inspection apparatus 200 according to various embodiments of the disclosure. The configuration of the defect inspection apparatus 200 is similar to the defect inspection apparatus 100 shown in FIG. 1, except that four wafers can be simultaneously inspected by the inspection apparatus 200. Like elements are designated with the same or similar reference numbers for ease of understanding and the details thereof are not repeated herein.

Referring to FIG. 2A and FIG. 2B, in some embodiments, the inspection apparatus 200 includes the optical module OM2, the wafer holder 160 for carrying wafers W1 and W2, the wafer holder 260 for carrying wafers W3 and W4, the one-way mirrors 151,152, 251, and 252 (one-way mirrors 251 and 252 are not shown in FIG. 2A), the optical sensors 171 and 172 and other two optical sensors not shown in the figures. The optical module OM2 may emit four light beams for inspecting the wafers W1 to W4 simultaneously. In some embodiments, the optical module OM2 includes the light source 110, the optical amplifier 120, the optical directional element 130, and the optical splitting element 240.

In some embodiments, the wafer holder 260 has a similar structure as the wafer holder 160. In some embodiments, the wafer holder 260 includes a wafer stage 261 and a wafer stage 262 connected to each other by a connecting element 265. The structural relations of the wafer stage 261, the wafer stage 262 and the connecting element 265 are similar to those of the wafer support 160, which are not described again here. It is noted that, the connecting element 161 and 265 of the wafer holders 160 and 260 are not shown in FIG. 2B for the sake of brevity. It should be understood that, in FIG. 2B, the wafer stages 161 and 162 are connected to each other by the connecting element 165, and the wafer stages 261 and 262 are connected to each other by the connecting element 265.

In some embodiments, similar to the wafer holder 160, the wafer holder 260 is also rotatable around the rotation axis RA by any reasonable degree, and the wafers carried by the wafer holder 260 may rotate around the rotation axis RA as the wafer holder 260 rotates. In alternative embodiments, the wafer holders 160 and 260 are not rotatable. In some embodiments, the wafer holder 160 is movable in the horizontal directions X and Y, while the wafer holder 260 is movable in the vertical direction Z and the horizontal direction X, such that the wafers carried by the wafer holders 160 and 260 may move along the corresponding directions as the wafer holders move. In some embodiments, the wafer holders 160 and 260 are separate from each other and may separately move along the same or different directions during the wafer inspection. In some embodiments, the inspection position of the wafer holders 160 and 260 are as shown in FIG. 2A and FIG. 2B, the wafer stages 161 and 162 of the wafer holder 160 are configured at opposite vertical sides of the optical splitting element 240, and the wafer stages 261 and 262 of the wafer holder 260 are configured at opposite lateral sides of the optical splitting element 240.

In some embodiments, the optical splitting element 240 of the optical module OM2 may split the light from the light source 110 into four light beams L1-L4 for inspecting four wafers W1-W4 carried by the wafer holders 160 and 260. In some embodiments, as shown in FIG. 2A and FIG. 2C, the optical splitting element 240 includes a first beam splitter 242, a second beam splitter 244, a third beam splitter 246 and a total reflection mirror 248.

In some embodiments, besides the optical amplifier 120, the optical module OM2 further includes a plurality of optical amplifiers (not shown) before and/or after the light being split by a beam splitter, so as to control the intensities of the light beams shone on the wafers. In some embodiments, as shown in FIG. 2A and FIG. 2B, optical amplifiers 281-284 are configured to amplify the light beams L1-L4, respectively. In detail, a first optical amplifier 281 is disposed between the first beam splitter 242 of the optical splitting element 240 and the one-way mirror 151; a second optical amplifier 282 is disposed between the second beam splitter 244 of the optical splitting element 240 and the one-way mirror 152; a third optical amplifier 283 is disposed between the third beam splitter 246 of the optical splitting element 240 and the one-way mirror 251; and a fourth optical amplifier 284 is disposed between the total reflection mirror 248 of the optical splitting element 240 and the one-way mirror 252. In some embodiments, the optical amplifiers are arranged between the first beam splitter 242 and the second beam splitter 244, between the second beam splitter 244 and the third beam splitter 246, and/or between the third beam splitter 246 and the total reflection mirror 248. In alternative embodiments, with the optical amplifiers described above, the optical amplifier 120 may be omitted.

When the light is split by the beam splitters 242, 244, and 246, the intensity of the light will drop after being split. With the optical amplifiers arranged on the optical paths, the light beams L1-L4 can be adjusted and controlled within a suitable range for inspecting the wafers W1 to W4. In some embodiments, the light beams L1 to L4 may be controlled to have substantially the same intensity to shine on the wafers.

In some embodiments, the optical module OM2 of the inspection apparatus 200 is free of any polarizer. In alternative embodiments, the optical module OM2 may include one or more polarizer for polarizing one or more of the light beams L1-L4, and the one or more polarizer may be disposed between the optical splitting element 240 and the one-way mirrors 151/152/251/252, or between the optical directional element 130 and the optical splitting element 240.

The inspection method using the inspection apparatus 200 is described below with reference to FIG. 2A to FIG. 2C and FIG. 6.

At act 610 and act 620, the wafers W1 and W2 are loaded to the wafer stages 161 and 162 of the wafer holder 160, the wafers W3 and W4 are loaded to wafer stages 261 and 262 of the wafer holder 260, respectively, and an alignment process is performed to determine origins of the wafer coordinate systems of the wafers. The loading method and alignment method are similar to those described with reference to FIG. 1. In some embodiments in which the wafer holders 160 and 260 are rotatable, each wafer may be loaded to the corresponding wafer stage at the loading position with the receiving surface of the wafer stage facing up. In some embodiments, before loading a wafer, one of the wafer stages 161,162,261,262 rotates to the loading position for loading one of the wafers W1-W4, and thereafter, the wafer stage carrying the wafer rotates to another position, and another one of the wafer stages rotates to the loading position for loading another one of the wafers. Herein, the loading position refers to the position where the receiving surface of the wafer stage faces up, such as the position where the wafer stage 161 is located shown in FIG. 2A.

Thereafter, the rotation and wafer loading are repeated until the four wafers W1-W4 are loaded to the four wafer stages 161, 162, 261, 261, respectively. As described above, the wafers W1 to W4 may be secured by the wafer stages through electrostatic force and/or mechanical force.

In some embodiments, after the wafers W1-W4 have been loaded to the wafer stages 161,162, 261, 262 in place, the wafer holders 160 and 260 rotate to the inspection position for wafer inspection. In some embodiments, the wafer stages of the wafer holder 160 rotate to overlap the optical splitting element 240 in the vertical direction Z, such that the wafers W1 and W2 carried by the wafer stages 161 and 162 are located on opposite vertical sides of the optical splitting element 240. The wafer stages of the wafer holder 260 rotate to overlap the optical splitting element 240 in the horizontal direction Y, such that the wafers W3 and W4 carried by the wafer stages 261 and 262 are located on opposite lateral sides of the optical splitting element 240. In some embodiments, the vertical distance between the wafer W1 and the optical splitting element 240 is substantially the same as or different from the vertical distance between the wafer W2 and the optical splitting element 240, and the lateral distance between the wafer W3 and the optical splitting element 240 is substantially the same as or different from the lateral distance between the wafer W4 and the optical splitting element 240. Thereafter, the wafer holders 160 and 260 may stop rotating and keep at the inspection position for wafer inspection.

In some embodiments in which the wafer holders 160 and 260 are not rotatable, the wafer holders 160 and 260 are configured at the inspection position, and the wafers W1 to W4 are respectively loaded to the wafer stages 161, 162, 261, 262 at the position shown in FIG. 2A and FIG. 2B.

Thereafter, at act 630, multi-wafer inspection is performed. In some embodiments, at act 631, the light L is emitted by the light source 110. The light L may be optionally amplified by the amplifier 120. Thereafter, the light L is directed to the optical splitting element 240 through the optical direction element 130.

At act 632, the light is split into a plurality of light beams, and the light beams are directed to the wafers carried by the wafer holders, respectively. In some embodiments, as shown in FIGS. 2A to 2C, the light L is split by the optical splitting element 240 into a first light beam L1, a second light beam L2, a third light beam L3 and a fourth light beam L4 for inspecting the wafers W1-W4, respectively.

In some embodiments, as shown in FIGS. 2A and 2C, the light L first enters the first beam splitter 242, and is split by the first beam splitter 242 into two lights L1 and L2'. A first part of the light L is reflected by the first beam splitter 242 and directed toward the wafer W1 as a first light beam L1. A second part of the light L (i.e. the light L2') goes through the first beam splitter 242 and enters the second beam splitter 244.

The light L2' is then split by the second beam splitter 244 into two lights L2 and L3'. A first part of the light L2' is reflected by the second beam splitter 244 and directed toward the wafer W2 as a second light beam L2. A second part of the light L2', that is, the light L3' goes through the second beam splitter 244 and enters the third beam splitter 246.

The light L3' is then split by the third beam splitter 246 into two lights L3 and L4. A first part of the light L3' is reflected by the third beam splitter 246 and directed toward the wafer W3 as a third light beam L3. A second part of the light L3', that is, the light L4, goes through the third beam splitter 246, and the light L4 is then reflected by the total reflection mirror 248 and directed toward the fourth wafer W4 as a fourth light beam L4.

In some embodiments, as shown in FIG. 2B, after the light L is split into the light beams L1-L4, the light beams L1-L4 may be amplified by the optical amplifiers 281-284, respectively, so as to have suitable intensities for inspecting the wafers. In some embodiments, after being amplified, the light beams L1 to L4 have substantially the same intensity. Thereafter, the light beams L1-L4 pass through the one-way mirrors 151, 152, 251, 252 and shine on the front surfaces F1 of the wafers W1-W4, respectively. Depending on the defect to be detected, the light beams L1 to L4 may be polarized or unpolarized, respectively. When a polarized light beam is needed, the light beam may be polarized by a polarizer before passing through the one-way mirror.

Referring to FIG. 2A and FIG. 2B, during the inspection, with the light beams L1-L4 shining on the front surfaces F1 of the wafers W1-W4, the wafer holder 160 moves along the horizontal directions X and Y, such that the wafer stages 161 and 162 carrying the wafers W1 and W2 move along the horizontal directions X and Y simultaneously; the wafer holder 260 moves along the horizontal and vertical directions X and Z, such that the wafer stages 261 and 262 carrying the wafers W3 and W4 moves along the horizontal and vertical directions X and Z simultaneously, such that the whole front surfaces F1 of the wafers W1-W4 are scanned. In some embodiments, the wafer holders 160 and 260 move simultaneously along the same direction or different directions, such that the wafers W1-W4 are inspected simultaneously.

At act 634, the light beams reflected from the wafers are received by optical sensors and inspection results of the wafers are generated. In some embodiments, the first light beam L1 is reflected by the wafer W1, and the first light beam L1 reflected by the wafer W1 is then reflected by the one-way mirror 151 and received by the optical sensor 171. The second light beam L2 is reflected by the wafer W2, and the second light beam L2 reflected by the wafer W2 is then reflected by the one-way mirror 152 and received by the optical sensor 172. The third light beam L3 is reflected by the wafer W3, and the third light beam L3 reflected by the third wafer W3 is then reflected by the one-way mirror 251 and received by an optical sensor (not shown). The fourth light beam L4 is reflected by the wafer W4, and the fourth light beam L4 reflected by the wafer W4 is then reflected by the one-way mirror 252 and received by an optical sensor (not shown). It is noted that, the optical sensors for receiving the light beams L3 and L4, and the reflections of the light beams L3 and L4 from the wafer W3 and W4 to the one-way mirrors 251, 252 and the reflections of the light beams L3 and L4 from the one-way mirrors 251, 252 to the optical sensors are similar to those described with respect to the light beams L1 and L2 and the optical sensors 171/171, and are not specifically shown in the figures.

After receiving the light beams L1-L4 reflected by the wafers W1-W4, the optical sensors generate the inspection results of the wafers W1-W4, respectively. At act 640, the inspection results (such as images) of the wafers are saved for further analysis. The defect determination method of the wafers are similar to those described with reference to FIG. 1, which are not described again here. Thereafter, at act 650, the wafers W1-W4 are unloaded from the wafer stages.

Figure 3:
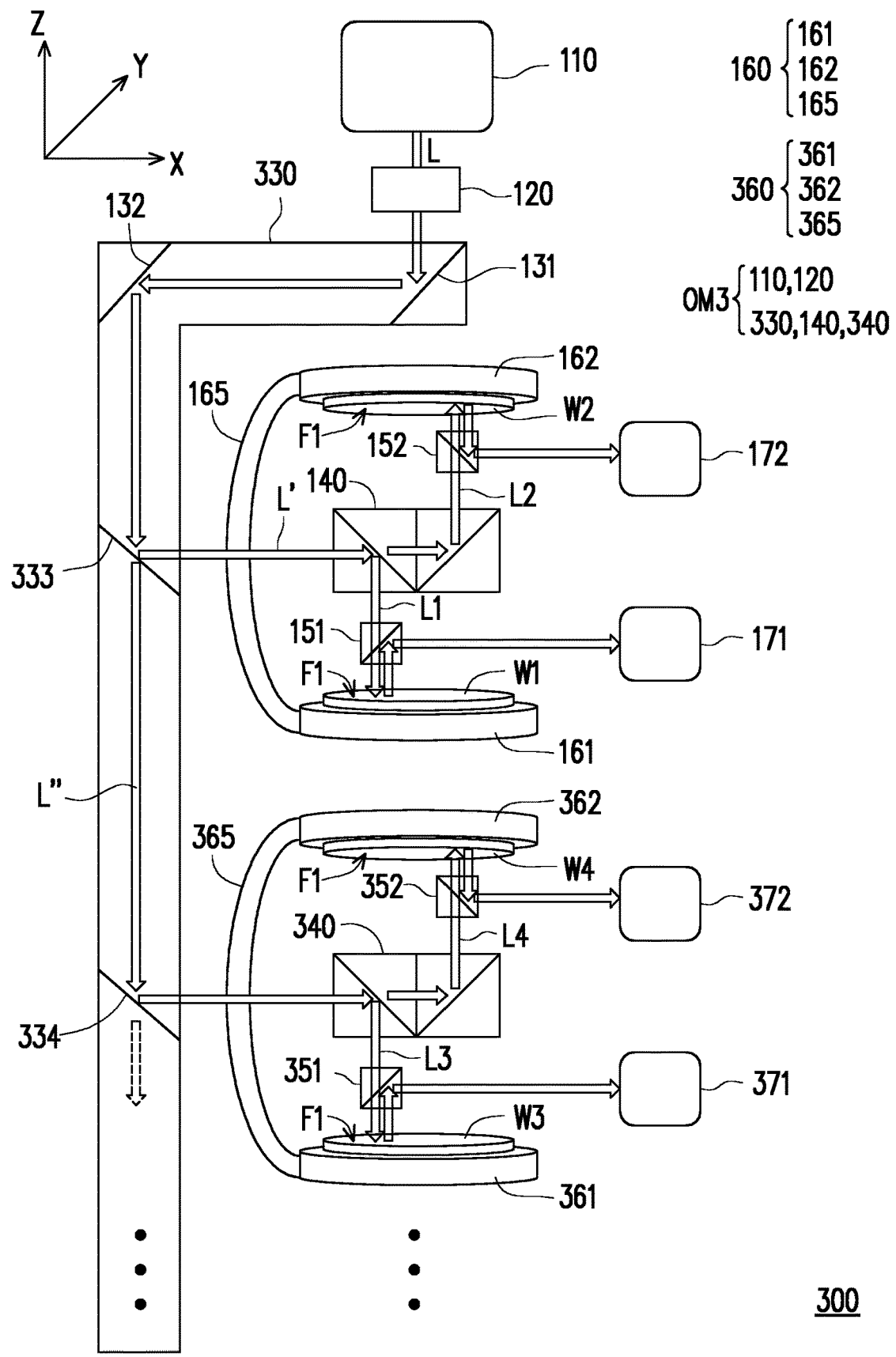
FIG. 3 is a schematic view of an inspection apparatus in accordance with a third embodiment of the disclosure.

FIG. 3 is a schematic view of an inspection apparatus 300 according to some embodiments of the disclosure. The configuration of the defect inspection apparatus 300 is similar to the defect inspection apparatus 100 shown in FIG. 1, except that multiple layers of wafer holders are included in the inspection apparatus 300. Like elements are designated with the same or similar reference numbers for ease of understanding and the details thereof are not repeated herein.

Referring to FIG. 3, in some embodiments, the inspection apparatus 300 includes an optical module OM3, a wafer holder set including a plurality of wafer holders (e.g. wafer holder 160 and 360) for carrying a plurality of wafers, one-way mirrors 151, 152, 351, 352, and optical sensors 171, 172, 371, 372. In some embodiments, the inspection apparatus 300 includes at least two wafer holders. The plurality of wafer holders may be arranged in the vertical direction Z and overlap each other in the vertical direction Z. In some embodiments, the inspection apparatus 300 includes a wafer holder 160 and a wafer holder 360 below the wafer holder 160. The wafer holder 360 includes substantially the same structure as the wafer holder 160. In some embodiments, the wafer holder 360 includes a wafer stage 361 for carrying a wafer W3 and a wafer stage 362 for carrying a wafer W4 connected to each other by a connecting element 365. Similar to the wafer holder 160, the wafer holder 360 may also be rotatable or not rotatable, and is movable along the horizontal directions, such as the directions X and Y. Although two wafer holders 160 and 360 are shown in FIG. 3, the disclosure is not limited thereto. More than two wafer holders may be included in the inspection apparatus 300, as represented by the ellipsis.

The optical module OM3 may include the light source 110, an optical amplifier 120, an optical directional splitting unit 330, and a plurality of optical splitting elements 140, 340.

The optical directional splitting unit 330 is configured to split the light L from the light source 110 into a plurality of lights and direct the plurality of lights toward the plurality of optical splitting elements 140, 340. In some embodiments, the optical direction splitting unit 330 includes reflective mirrors 131, 132, one or more beam splitters, such as the beam splitter 333, and an optical component 334. The optical component 334 may be a total reflection mirror when the wafer holder 360 is the last wafer holder in a wafer hold set, which is most distal the light source along the path of the optical directional splitting unit 330 (e.g. when the wafer holder 360 is a bottommost wafer holder). In some embodiments in which more wafer holders are disposed under the wafer holder 360, the optical component 334 is a beam splitter, and a total reflection mirror is disposed corresponding to the bottommost wafer holder.

The optical splitting elements 140, 340 are disposed between the wafer stages of the corresponding wafer holder 160, 260 and configured to split the light from the optical directional splitting unit 330 into a plurality of light beams for inspecting the corresponding wafers. The configuration of each optical splitting element and corresponding wafer holder is similar to that of the optical splitting element 140 and the wafer holder 160 as described with reference to FIG. 1.

The inspection method using the inspection apparatus 300 is similar to that of the inspection apparatus 100. At act 610, the wafers W1-W4 are loaded to the wafer stages 161, 162, 361, 362 of the wafer holders 160, 360. In some embodiments, the wafers W1-W4 are carried by the wafer stages 161, 162, 361, 362 by electrostatic force and/or mechanical force, respectively. At act 620, an alignment is executed to determine origins of the wafer coordinate system of the wafers W1-W4. Thereafter, at act, multi-wafer inspection is performed.

In some embodiments, at act 631, the light L is emitted by the light source 110. The light L may be amplified by the optical amplifier 120 before entering the optical directional splitting unit 330. At act 632, the light L is split into a plurality of light beams L1 to L4 directed toward wafers W1 to W4. In some embodiments, the light L enters the optical directional splitting unit 330, the light L is reflected by the reflectors 131 and 132 in sequence and then split by the beam splitter 333 into two portions L' and L". The first portion L' of the light L is reflected by the beam splitter 333 and directed toward the optical splitting element 140. The second portion L" of the light L transmits through the beam splitter 333 and may be partially or completely reflected by the optical component 334 and directed toward the optical splitting element 340. In some embodiments in which the wafer holder 360 is the bottommost wafer holder and the optical component 334 is a total reflection mirror, the second portion L" of the light L is substantially completely reflected by the total reflection mirror 334 and directed toward the optical splitting element 340. In some embodiments in which other wafer holders are disposed below the wafer holder 360 and the component 334 is a beam splitter, the second portion L" of the light L is further split by the beam splitter 334 into two part. In some embodiments, half of the second portion L" of the light L is reflected by the beam splitter 334 and directed toward the optical beam splitting element 340, and the other half of the second portion L" of the light L transmits through the beam splitter 334 for the wafers carried by the wafer holders in next layers. In some embodiments, after the light L is split into two portions L' and L" and before the first portion L' and the second portion L" of the light L enter the optical splitting elements 140 and 340, the first portion L' and second portion L" of the light L are amplified by optical amplifiers (not shown) which may be disposed between the optical directional splitting element 330 and the optical splitting elements 140, 340, so as to adjust the intensities of the light beams L1-L4 directed to the wafers.

The first portion L' of the light L is then split by the optical splitting element 140 into a first light beam L1 and a second light beam L2 for inspecting the wafers W1 and W2 carried by the wafer holder 160. The second portion L" of the light L is then split by the optical splitting element 340 into a third light beam L3 and a fourth light beam L4 for inspecting the wafers W3 and W4 carried by the wafer holder 360. In some embodiments, the adjusting of the intensities of the light beams L1-L4 may be performed after the first and second portions L' and L" being split by the optical splitting elements 140, 340. In some embodiments, the light beams L1-L4 may be amplified to desired intensities before going through the one-way mirrors by the amplifiers (not shown) disposed between the optical splitting element 140, 340 and the corresponding one-way mirrors 151, 152, 351, 352. The light beams L1-L4 may be unpolarized or polarized, respectively. In some embodiments, at least one of the light beams L1-L4 is polarized by the polarizer(s) (not shown) disposed between the optical splitting element and the corresponding one-way mirror.

Thereafter, the light beams L1-L4 respectively transmit through a corresponding one-way mirror 151, 152, 351, 352 and shine on the wafers W1-W4, respectively.

During the wafer inspection, with the light beams L1-L4 shining on the wafers W1-W4, the wafer holders 160 and 360 may move along the horizontal direction X/Y simultaneously, such that the wafers W1-W4 carried by the wafer stages of the wafer holders 160 and 360 move along the horizontal directions X/Y simultaneously, and the whole front surfaces F1 of the wafers W1-W4 may be scanned by the light beams L1-L4, respectively.

At act 634, the light beams L1-L4 are reflected by the wafers W1-W4, and the light beams reflected by the wafers W1-W4 are then reflected by the one-way mirrors 151, 152, 351, 352 and received by the optical sensors 171, 172, 371, 372, respectively. Thereafter, upon receiving the light beams L1-L4 reflected by the wafers W1-W4, the optical sensors 171, 172, 371, 372 generate the inspection result of the wafers W1-W4, such as the images of the wafers W1-W4. At act, the inspection result is saved. At act 650, the wafers W1-W4 are unloaded from the wafer holders 160 and 360.

Figure 4:
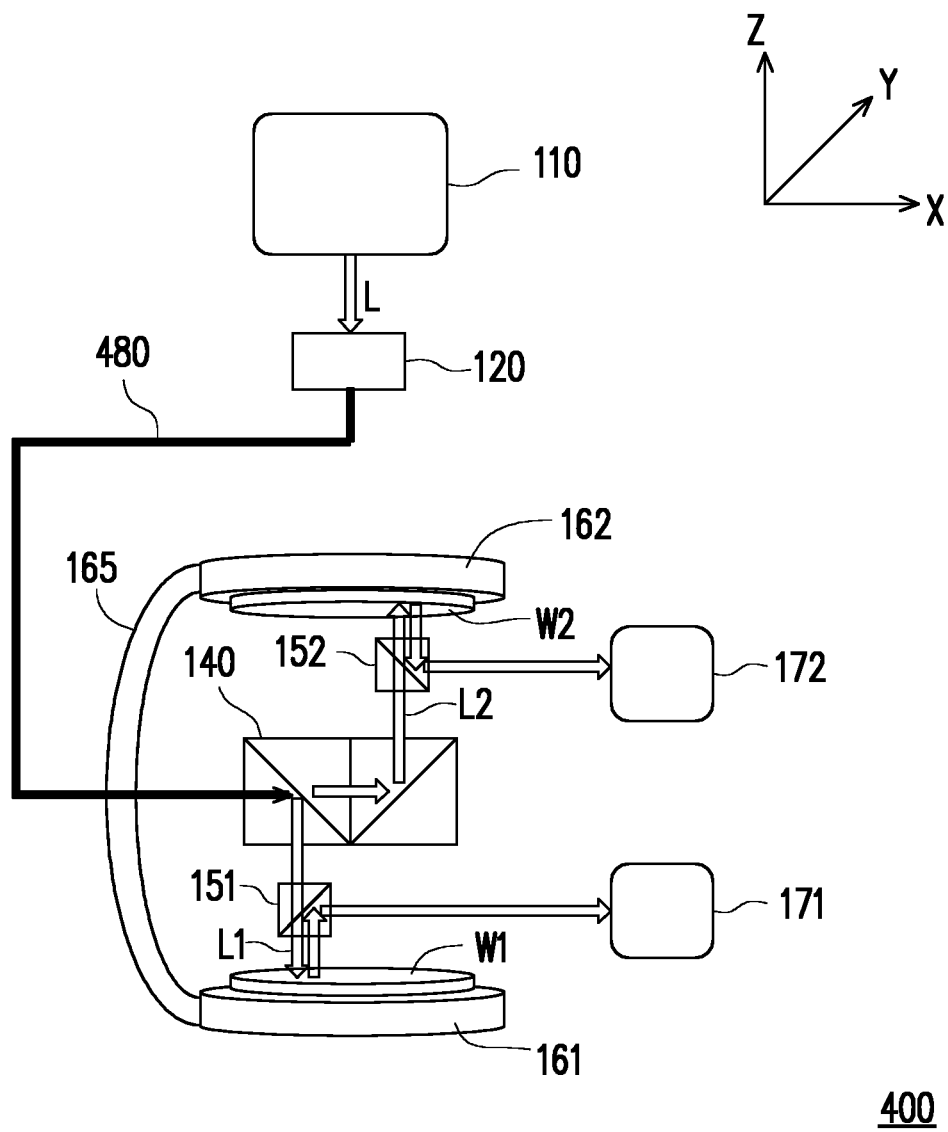
FIG. 4 is a schematic view of an inspection apparatus in accordance with a fourth embodiment of the disclosure.

FIG. 4 is a schematic view of an inspection apparatus 400 according to a fourth embodiment. The configuration of the inspection apparatus 400 is similar to the inspection apparatus 100 shown in FIG. 1, except that the optical directional element is an optical fiber 480 instead of a reflective mirror unit. The optical fiber 480 is configured to guide the light L to the optical splitting element 140. In alternative embodiments, the optical directional element may include a combination of reflective mirrors and optical fiber.

In some embodiments, after being amplified by the optical amplifier 120, the light L emitted by the optical source 110 is guided to the optical splitting element 140 by the optical fiber 480. The optical fiber 480 is more flexible in transmitting the light L. Also, by using the optical fiber 480, the size of the optical directional element may be reduced. The other structures of the inspection apparatus 400 and the inspection method using the inspection apparatus 400 are similar to those described with reference to FIG. 1, which are not described again here.

In the foregoing embodiments, the light source 110 is disposed over the wafer holder(s), and the optical directional element is needed to adjust the light path of the light emitted by the light source 110. However, the disclosure is not limited thereto.

Figure 5:
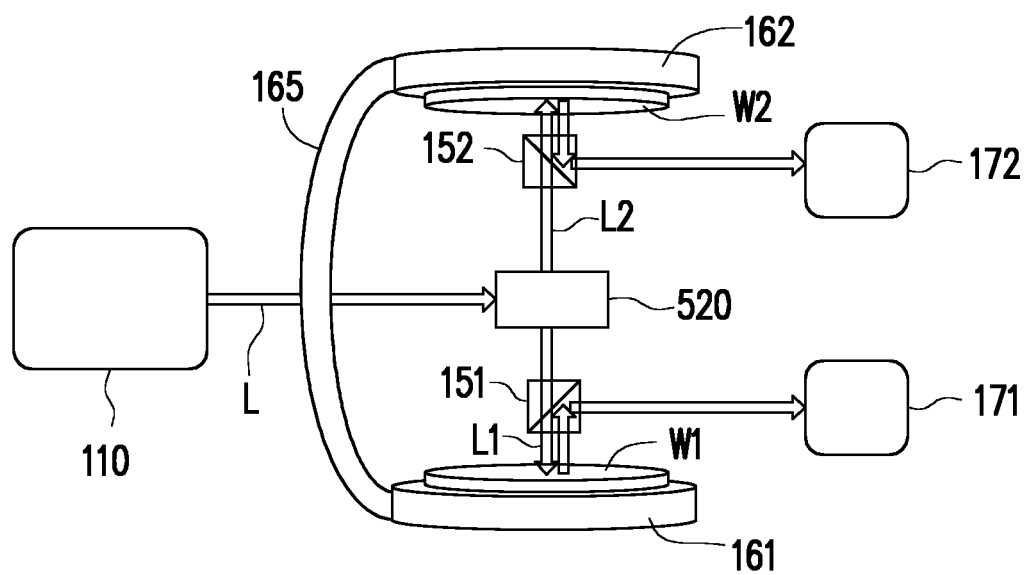
FIG. 5 is a schematic view of an inspection apparatus in accordance with a fifth embodiment of the disclosure.

FIG. 5 is a schematic view of an inspection apparatus 500 according to at least one embodiment of the disclosure. The configuration of the inspection apparatus is similar to the defect inspection apparatus shown in FIG. 1, except that the light source 110 is disposed aside the wafer holder 160, and the optical splitting element 140 is replaced by an integrated optical element 520. The integrated optical element 520 is configured to split the light from the light source 110 into a plurality of light beams for inspecting multiple wafers.

In some embodiments, the light source 110 is disposed laterally aside the integrated optical element 520, and the light L emit from the light source 110 is directed toward the integrated optical element 520 directly. As such, the directional element for guiding the light L may be omitted. When the light L enters the integrated optical element 520, the light L is split by the integrated optical element 520 into a plurality of light beams for inspecting the wafers carried by the wafer holder 160, respectively.

In some embodiments, the integrated optical element 520 is or includes an optical coupler, arrayed waveguide grating (AWG), combinations thereof or the like. In some embodiments, the integrated optical element 520 includes a plurality of optical components which are combined to fulfill some complex functions. Such optical components, for example, may be optical filters, modulators, amplifiers, splitters or the like. These optical components, for example, can be fabricated on the surface of some crystalline material (such as silicon, silica, or $LiNbO_3$) and connected with waveguides.

Figure 8:
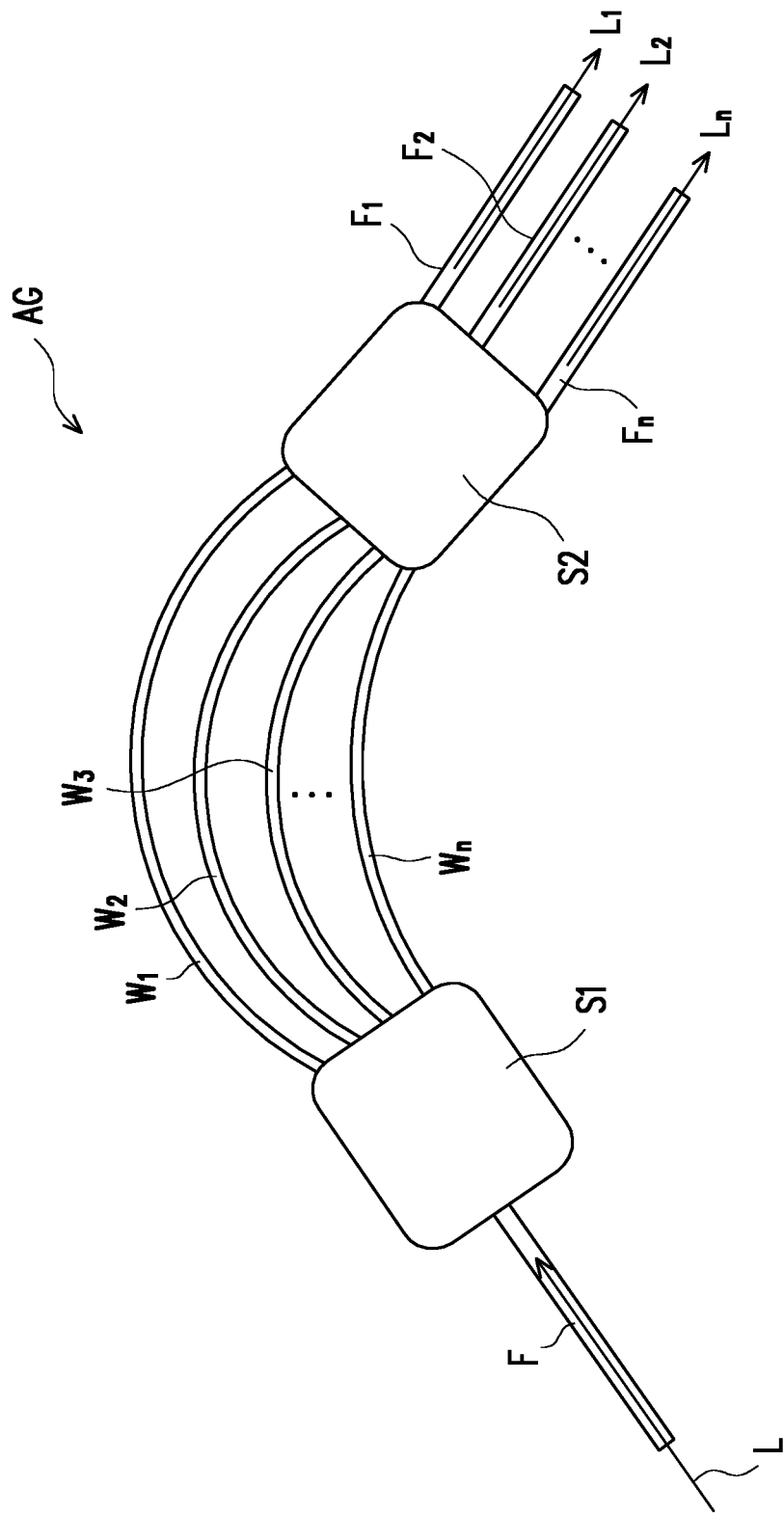
FIG. 8 is a schematic view illustrating an arrayed waveguide grating in accordance with some embodiments of the disclosure.

In some embodiments, the integrated optical element 520 includes an arrayed waveguide grating AG. A structure of arrayed waveguide grating AG in accordance with at least one embodiment is illustrated in FIG. 8. In some embodiments, the arrayed waveguide grating AG includes an input optical fiber F, free space propagation regions S1 and S2, a waveguide array including a plurality of channel waveguides $W_1, W_2, W_3 \ldots W_n$, and a plurality of output optical fibers $F_1, F_2 \ldots F_n$. The input optical fiber F is configured to input an incident light. The free space propagation region S1 is coupled to an end of the optical fiber F and may include an input cavity, coupler part or slab waveguide. The channel waveguides $W_1, W_2, W_3 \ldots W_n$ are connected to an end of the free space propagation region S1. The channel waveguides have different lengths and are arranged side by side. The free space propagation region S2 is connected to ends of the channel waveguides $W_1, W_2, W_3 \ldots W_n$ and may include an output cavity, coupler part, or slab waveguide. The output optical fibers $F_1, F_2 \ldots F_n$ are connected to an end of the free space propagation region S2 and configured to output a plurality of lights split from the incident light. In some embodiments, an incident light such as a light L is fed using the optical fiber F into the free space propagation region S1. The light L may be a wavelength multiplexed light having various wavelengths. The light L passes through the free propagation region S1 and enters the channel waveguides $W_1, W_2, W_3 \ldots W_n$. The phase delay proportional to wavelength is introduced to light signals passed from different channel waveguides of different lengths. These phase delayed signals are made to pass from the free propagation region S2. Light signals after passing through different lengths of channel waveguides interfere with one another and are refocused at the output optical fibers $F_1, F_2 \ldots F_n$. As a result, each of the output optical fiber $F_1, F_2 \ldots F_n$ is fed with one unique wavelength of light having maximum amplitude. In some embodiments, a plurality of lights $L_1, L_2 \ldots L_n$ is output from the optical fibers $F_1, F_2 \ldots F_n$. In other words, the incident light having at least two wavelengths is split by the arrayed waveguide grating AG into at least two lights, and each of the at least two lights has a single wavelength. It is noted that, the number of the channel waveguides, the number of the output optical fibers and the number of lights output from the optical fibers are not limited in the disclosure.

Referring back to FIG. 5, the integrated optical element 520 may split the light L from the light source 110 into at least two light beams, such as the light beams L1 and L2, for inspecting the wafers W1 and W2. The integrated optical element 520 may further amplify the light L, so as to control the intensities of the light beams directed to the wafers carried by the wafer holder 160. The other structures of the inspection apparatus 500 and the inspection method using the inspection apparatus 500 are similar to those described with reference to FIG. 1, which are not described again here.

In the embodiments of the disclosure, the inspection apparatus includes one or more wafer holders including a plurality of wafer stages for carrying a plurality of wafers, and the optical module of the inspection apparatus is configured to emit a plurality of light beams for inspecting the plurality of wafers simultaneously, so as to implement multi-wafer inspection. As such, the wafer inspection efficiency is improved, and the yield is thus improved.

In accordance with some embodiments of the disclosure, a wafer inspection apparatus includes a light source, a first optical splitting element, a first wafer holder, a first optical sensor and a second optical sensor. The light source is configured to emit a light. The first optical splitting element is configured to split the light from the light source into a first light beam and a second light beam. The first wafer holder includes a first wafer stage for carrying a first wafer and a second wafer stage for carrying a second wafer. The first wafer is configured to reflect the first light beam, and the second wafer is configured to reflect the second light beam. The first optical sensor is configured to receive the first light beam reflected by the first wafer carried by the first wafer stage. The second optical sensor is configured to receive the second light beam reflected by the second wafer carried by the second wafer stage.

In accordance with some embodiments of the disclosure, a wafer inspection apparatus includes an optical module, at least one wafer holder for carrying a plurality of wafers and a plurality of optical sensors. The optical module is configured to emit a plurality of light beams for simultaneously scanning the plurality of wafers carried by the at least one wafer holder. The plurality of optical sensors is configured to receive the light beams reflected by the plurality of wafers.

In accordance with some embodiments of the disclosure, a wafer inspection method includes: loading a plurality of wafers to at least one wafer holder; and inspecting the plurality of wafers simultaneously, comprising: emitting a plurality of light beams from an optical module, and the plurality of light beams are directed toward the plurality of wafers; and receiving the plurality of light beams reflected by the wafers through a plurality of optical sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer inspection apparatus, comprising:
   an optical module comprising a light source and a first optical splitting element, wherein a light emitted from the light source is split into a first light beam and a second light beam, the first light beam and the second light beam propagate along two opposite directions;
   a first wafer holder, comprising a first wafer stage for carrying a first wafer and a second wafer stage for carrying a second wafer, wherein the first wafer stage is disposed on a first light path of the first light beam, and the second wafer stage is disposed on a second light path of the second light beam, and the first optical splitting element is disposed between the first wafer stage and the second wafer stage;
   a first optical sensor, configured to receive the first light beam reflected by the first wafer carried by the first wafer stage; and
   a second optical sensor, configured to receive the second light beam reflected by the second wafer carried by the second wafer stage.

2. The wafer inspection apparatus of claim 1, wherein the first wafer stage comprises a first electrostatic chuck and the second wafer stage comprises a second electrostatic chuck, and the first wafer and the second wafer are carried by the first electrostatic chunk and the second electrostatic chuck through electrostatic forces, respectively.

3. The wafer inspection apparatus of claim 1, wherein the first wafer holder further comprises a connecting element, and the first wafer stage and the second wafer stage are connected to each other through the connecting element.

4. The wafer inspection apparatus of claim 1, wherein a first receiving surface of the first wafer stage faces a second receiving surface of the second wafer stage.

5. The wafer inspection apparatus of claim 4, wherein the first wafer holder is rotatable about a rotation axis along a direction parallel with the first receiving surface of the first wafer stage and the second receiving surface of the second wafer stage.

6. The wafer inspection apparatus of claim 1 further comprising an optical directional element, wherein the optical directional element is configured to guide the light emitted from the light source to the first optical splitting element.

7. The wafer inspection apparatus of claim 6, wherein the optical directional element comprises at least one selected from a group of a reflector unit and an optical fiber.

8. The wafer inspection apparatus of claim 1 further comprising an optical amplifier configured to control intensities of the first light beam and the second light beam.

9. The wafer inspection apparatus of claim 1 further comprising a second wafer holder, wherein the second wafer holder comprises a third wafer stage for carrying a third wafer and a fourth wafer stage for carrying a fourth wafer, and the light emitted from the light source is split into a third light beam and a fourth light beam, the third light beam and the fourth light beam propagate along two opposite directions, wherein the third wafer stage is disposed on a third light path of first light beam, and the second wafer stage is disposed on a second light path of the second light beam, and the first optical splitting element is disposed between the first wafer stage and the second wafer stage.

10. The wafer inspection apparatus of claim 1, further comprising:
    an optical directional splitting unit configured to split the light emitted from the light source into a first portion and a second portion and direct the first portion to the first optical splitting element and direct the second portion to a second optical splitting element, wherein the first portion is split by the first optical splitting element into the first light beam and the second light beam, and the second portion is split by the second optical splitting element into a third light beam and a fourth light beam; and
    a second wafer holder, comprising a third wafer stage for carrying a third wafer and a fourth wafer stage for carrying a fourth wafer, wherein the third wafer is configured to reflect the third light beam, and the fourth wafer is configured to reflect the fourth light beam;
    a third optical sensor, configured to receive the third light beam reflected by the third wafer; and
    a fourth optical sensor, configured to receive the fourth light beam reflected by the fourth wafer.

11. A wafer inspection method, comprising:
    loading a first wafer and a second wafer to a wafer holder, wherein the wafer holder comprises a first wafer stage for carrying the first wafer and a second stage for carrying the second wafer;
    providing a light through a light source;
    splitting the light into a first light beam and the second light beams through an optical splitting element disposed between the first wafer stage and the second wafer stage, wherein the first light beam and the second light beam are directed to propagate along opposite directions such that the first light beam is irradiated on the first wafer and the second light beam is irradiated on the second wafer; and receiving the first light beam reflected by the first wafer and the second light beam reflected by the second wafer through optical sensors.

12. The method of claim 11, wherein loading the first wafer and the second wafer to the wafer holder comprises:
loading the first wafer to the first wafer stage;
rotating the first wafer holder, such that the first wafer holder is flipped upside down; and
loading the second wafer to the second wafer stage.

13. The method of claim 11, wherein
during inspecting the first wafer and the second wafer, with the first and second light beams shining on the first and second wafers, the first and second wafers move simultaneously as the wafer holder moves.

14. A wafer inspection apparatus, comprising:
an optical module comprising a light source and a first optical splitting element, wherein a light emitted from the light source is split into a first light beam and a second light beam;
a first wafer holder, comprising a first wafer stage for carrying a first wafer and a second wafer stage for carrying a second wafer, wherein the first optical splitting element is disposed between the first wafer stage and the second wafer stage; and
optical sensors, wherein the first light beam is reflected by the first wafer carried by the first wafer stage, the second light beam is reflected by the second wafer carried by the second wafer stage, and the first light beam reflected by the first wafer and the second light beam reflected by the second wafer are received by the optical sensors.

15. The wafer inspection apparatus of claim 14, wherein the first wafer stage comprises a first electrostatic chuck and the second wafer stage comprises a second electrostatic chuck, and the first wafer and the second wafer are carried by the first electrostatic chunk and the second electrostatic chuck through electrostatic forces, respectively.

16. The wafer inspection apparatus of claim 14, wherein the first wafer holder further comprises a connecting element, and the first wafer stage and the second wafer stage are connected to each other through the connecting element.

17. The wafer inspection apparatus of claim 14, wherein a first receiving surface of the first wafer stage faces a second receiving surface of the second wafer stage.

18. The wafer inspection apparatus of claim 17, wherein the first wafer holder is rotatable about a rotation axis along a direction parallel with the first receiving surface of the first wafer stage and the second receiving surface of the second wafer stage.

19. The wafer inspection apparatus of claim 14 further comprising an optical directional element, wherein the optical directional element is configured to guide the light emitted from the light source to the first optical splitting element.

20. The wafer inspection apparatus of claim 14 further comprising:
an optical directional splitting unit configured to split the light emitted from the light source into a first portion and a second portion and direct the first portion to the first optical splitting element and direct the second portion to a second optical splitting element, wherein the first portion is split by the first optical splitting element into the first light beam and the second light beam, and the second portion is split by the second optical splitting element into a third light beam and a fourth light beam;
a second wafer holder, comprising a third wafer stage for carrying a third wafer and a fourth wafer stage for carrying a fourth wafer, wherein the third wafer is configured to reflect the third light beam, and the fourth wafer is configured to reflect the fourth light beam;
a third optical sensor, configured to receive the third light beam reflected by the third wafer; and
a fourth optical sensor, configured to receive the fourth light beam reflected by the fourth wafer.

* * * * *